Figure 1:
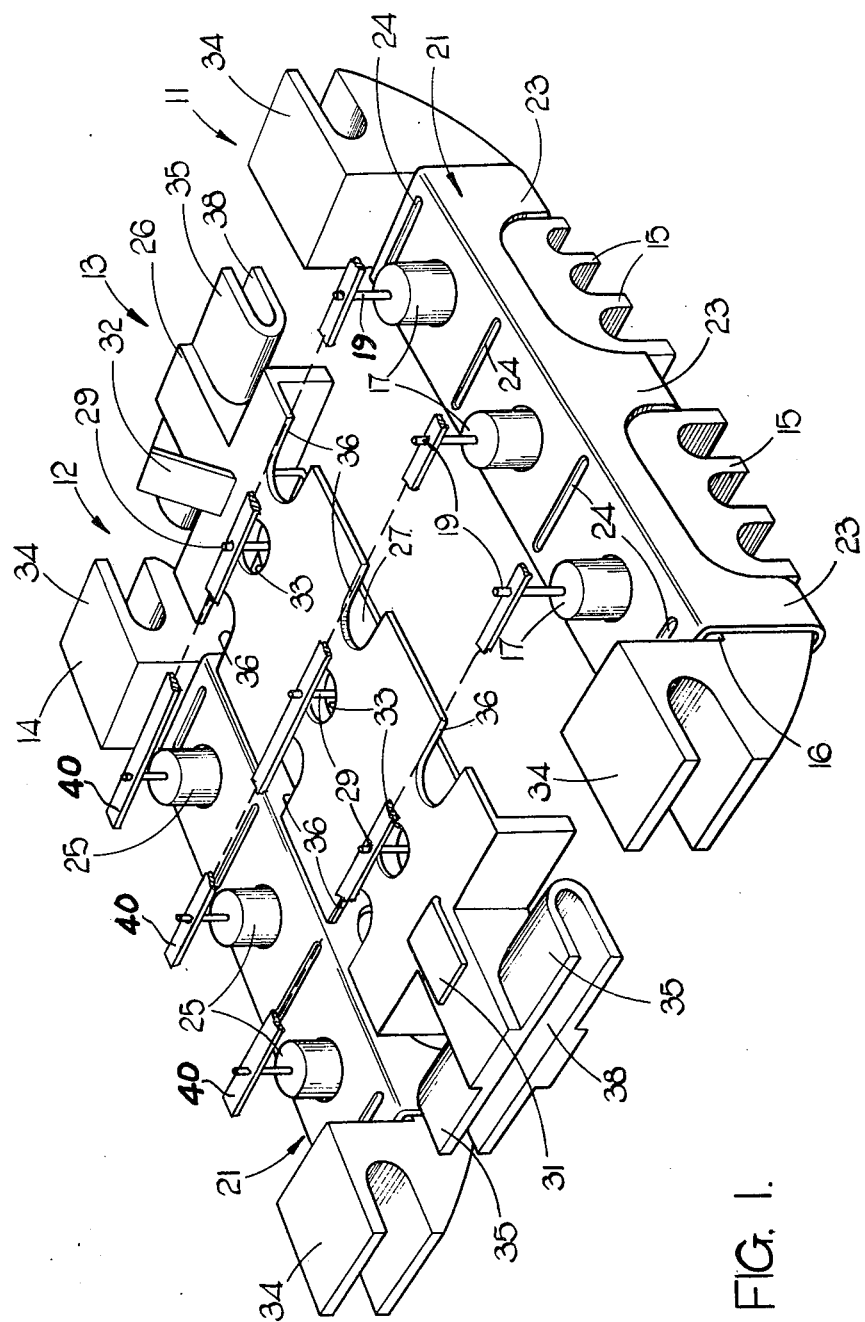

United States Patent [19]

Allport

[11] 4,007,402

[45] Feb. 8, 1977

[54] THREE PHASE FULL WAVE RECTIFIER ASSEMBLY

[75] Inventor: Maurice James Allport, West Midlands, England

[73] Assignee: The Lucas Electrical Company Limited, Birmingham, England

[22] Filed: May 29, 1975

[21] Appl. No.: 581,882

[30] Foreign Application Priority Data

June 8, 1974 United Kingdom ............. 25550/74

[52] U.S. Cl. ............................... 317/100; 321/8 C; 357/76
[51] Int. Cl.² ....................................... H01L 23/40
[58] Field of Search ................. 321/8 C; 310/68 D; 317/100; 174/16 HS; 357/76, 77, 81

[56] References Cited

UNITED STATES PATENTS

| 3,320,498 | 5/1967 | Evans | 357/76 |
| 3,435,891 | 4/1969 | Parrish | 317/100 |
| 3,745,505 | 7/1973 | Turnbull | 357/76 |

FOREIGN PATENTS OR APPLICATIONS 1,047,197  11/1966  United Kingdom

Primary Examiner—Gerald P. Tolin
Attorney, Agent, or Firm—Olson, Trexler, Wolters, Bushnell & Fosse, Ltd.

[57] ABSTRACT

A three phase full wave rectifier assembly includes first and second sub-assemblies each of which includes three semi-conductor diodes. In addition, each sub-assembly includes an electrically conductive heat sink the three diodes of the first sub-assembly being secured to the first heat sink with their anodes electrically connected thereto, and the three diodes of the second sub-assembly being secured to the second heat sink with their cathodes electrically connected thereto. Each set of three diodes is secured to its respective heat sink by means of a common clip which engages the heat sink there being a resilient member acting between each clip and the respective three diodes to urge the diodes firmly into contact with the respective heat sink. Additionally, there are three phase connectors, each phase connector being electrically connected to a cathode of a diode of the first sub-assembly and an anode of a diode of the second sub-assembly.

2 Claims, 3 Drawing Figures

THREE PHASE FULL WAVE RECTIFIER ASSEMBLY

This invention relates to a three phase full wave rectifier assembly.

An assembly according to the invention includes first and second sub-assemblies each including three semi-conductor diodes and an electrically conductive heat sink, the three diodes of the first sub-assembly being secured to the first heat sink with, their anodes electrically connected thereto, by means of a common clip which engages the heat sink, there being resilient means acting between the clip and the diodes to urge the diodes firmly into contact with the heat sink, the second sub-assembly being constructed in a manner similar to said first sub-assembly but with the cathodes of the diodes electrically connected to the heat sink, and three phase connectors, each connector being electrically connected to a cathode of a diode of the first sub-assembly and an anode of a diode of the second sub-assembly.

Preferably the assembly includes a third sub-assembly comprising three semi-conductor diodes each having one terminal connected to a metal carrier and their other terminal connected to a respective phase connector, said carrier being mounted on an insulating body to which the first and second sub-assemblies are connected.

Figure 2:
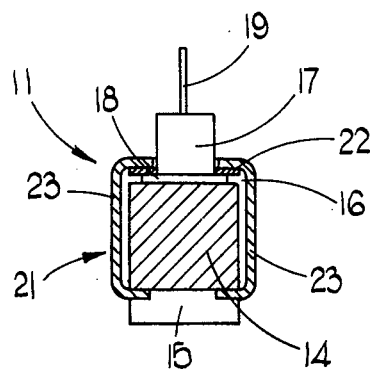
Figure 3:
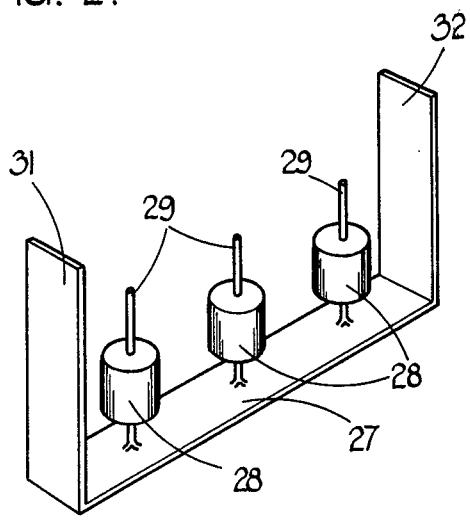

One example of the invention is illustrated in the accompanying drawings wherein, FIG. 1 is an exploded perspective view of part of a three phase full wave rectifier assembly, FIG. 2 is a sectional view of part of the assembly shown in FIG. 1, and FIG. 3 is a perspective view, to a reduced scale, of a further part of the assembly shown in FIG. 1.

Referring to the drawings, the three phase, full wave rectifier assembly includes a pair of full wave rectifiers, and is for use in rectifying the three phase output of a road vehicle alternator. The assembly provides an output for charging the vehicle battery, and a subsidiary output for operating an indicator lamp and the voltage regulator associated with the charging system of the vehicle.

The assembly includes first, second and third sub-assemblies 11, 12, 13 respectively. The sub-assembly 11 consists of a die-cast zinc or aluminium heat sink 14 one side of which is provided with heat dissipation fins 15. The face of the heat sink 14 opposite the fins 15 is recessed and defines a flat surface 16 upon which three semi-conductor diodes 17 are seated. Each semi-conductor diode 17 comprises a semi-conductor chip within a cylindrical, metal, outer casing, the casing having a flange 18 at one axial end thereof. The anode of each semi-conductor chip is electrically connected to its respective metal casing, while the cathode of each chip is connected to a conductive lead 19 extending from, and electrically insulated from the respective casing.

The plane faces of the flanges 18 of the diodes 17 engage the flat surface 16 of the heat sink. In order to retain the diodes in position relative to the heat sink there is provided a single metal clip 21 having three apertures therein through which the cylindrical portions of the bodies of the diodes 17 can extend. The apertures in the clip are of smaller diameter than the flanges 18, and interposed between the inner surface of the clip 21 and the upper surfaces of the flanges 18 is a metal spring pressure plate 22 (FIG. 2). The plate 22 is apertured to receive the cylindrical bodies of the diodes 17, and the clip 21 is provided with a plurality of pairs of arms 23 which extend around the heat sink 14 and engage the under surface of the heat sink between the fins 15. During assembly, the clip 21 is urged firmly towards the surface 16 prior to deformation of the arms 23 so that after deformation the arms 23 retain the pressure plates 22 in a stressed condition. Thus the clip 21 and the pressure plate 22 trap the diodes against the heat sink, the flanges 18 of the diodes bearing firmly against the surface 16. Since the flanges 18 of the diodes are electrically connected to the anodes of the semi-conductor chips then the heat sink 14 will be electrically connected to the anodes of the three diodes 17. The clip 21 is formed with a plurality of transverse ribs 24 projecting from the under side thereof, and engaging the pressure plate 22. The ribs 24 ensure that clamping pressure is applied by the spring 22 adjacent the flanges 18.

The sub-assembly 12 is substantially identical to the sub-assembly 11, with the principal exception that the diodes 25 thereof are assembled with the cathodes of their semi-conductor chips electrically connected to their cylindrical casing. Thus in the sub-assembly 12 the cathodes of the diodes 25 are electrically connected to the heat sink 14.

In use, the first and second sub-assemblies 11, 12 constitute the principal full wave rectifier supplying the battery of the vehicle in use.

The third sub-assembly 13 comprises a moulded synthetic resin body 26 to which the sub-assemblies 11, 12 can be assembled as will be described later.

The body 26 carries a copper strip 27 upon which are supported a further three semi-conductive diodes 28. The diodes 28 have their anodes physically and electrically connected to the strip 27, and their cathodes connected to respective terminal leads 29. The diodes 28 can take the form of the diodes 17 and 25, in which case their casings will be soldered, or otherwise physically and electrically connected to the strip 27, or, alternatively, the diodes can have both anode and cathode connected to respective terminal leads the anode terminal leads being soldered to the strip 27 as shown in FIG. 3. The diodes 28 are linearly aligned on the strip 27, and are spaced apart by a distance equal to the spacing of the diodes 17 of the first sub-assembly, and the diodes 25 of the second sub-assembly. The free ends of the two vertical limbs of the strip 27 extend upwardly through slots in the body 26, the free end of the limb 31 being bent to engage the upper surface of the body 26, and the free end of the limb 32 being bent to extend outwardly from the upper surface of the body 26 at an angle thereto, to define a blade terminal. The terminal leads 29 of the diodes 28 extend vertically upwardly through respective apertures 33 in the body 26.

The first and second sub-assemblies 11, 12 are assembled to the third sub-assembly in a direction transverse to the length of the sub-assemblies. The heat sinks 14 of the sub-assemblies 11, 12 are provided at their opposite axial ends with transversely slotted lugs 34 and the body 26 is provided with transversely extending tongues 35 which can enter the recesses of the lugs 34. Furthermore, the opposite longitudinal edges of the body 26 are formed with closed ended slots 36 into which the terminal leads 19 of the diodes 17, and the terminal leads of the diodes 25 extend when the sub-assemblies 11, 12 are assembled to the sub-assembly 13. Thus when the three sub-assemblies are interconnected the width of the assembly is substantially equal to that of the body 26, and the body 26 electrically and physically separates the heat sinks 14 of the sub-assemblies 11, 12. Moreover, the terminal leads of the diodes 17, 25, 28 are arranged in three transversely extending rows of three each transverse row including the cathode terminal wire 19 of a diode 17, the cathode terminal wire 29 of a diode 28, and the anode terminal wire of a diode 25.

The rectifier assembly further includes three phase connectors 40 each of which is in the form of a narrow copper strip extending transversely of the assembly, each strip engaging the three terminal wires of a respective transverse row of terminal wires. Thus each phase connector is electrically connected to the anode of a diode 25, the cathode of a diode 28, and the cathode of a diode 17.

The three sub-assemblies are secured together by transversely extending bolts which pass along channels 38 in the projections 35 of the body 26. The heads and nuts of the bolts act on the lugs 34 of the heat sinks 14 respectively to pull the heat sinks 14 towards one another. Insulating washers are associated with the bolts and so arranged that one of the bolts is electrically connected to the heat sink of the sub-assembly 11, but insulated from the heat sink of the sub-assembly 12, while the other bolt is electrically connected to the heat sink of the sub-assembly 12 but electrically insulated from the heat sink of the sub-assembly 11. Thus one of the bolts constitutes a positive output terminal, the other of the bolts constitutes a negative output terminal, and the limb 32 of the strip 27 comprises a positive output terminal. In use, the three phase connectors are electrically connected to the phase points of the three phase alternator, the two bolts comprise the main output terminals of the full wave rectifier assembly, supplying the battery of the vehicle, and the limb 32 of the strip 27 comprises the subsidiary output for operating the indicator lamp and voltage regulator associated with the charging system of the vehicle.

I claim:

1. A three phase full wave rectifier assembly including first and second sub-assemblies each including three semi-conductor diodes and an electrically conductive heat sink, the three diodes of the first sub-assembly being secured to the first heat sink with their anodes electrically connected thereto, by means of a common clip which engages the heat sink, there being resilient means acting between the clip and the diodes to urge the diodes firmly into contact with the heat sink, the second sub-assembly being constructed in a manner similar to said first sub-assembly but with the cathodes of the diodes thereof electrically connected to the heat sink, and three phase connectors, each connector being electrically connected to a cathode of a diode of the first sub-assembly and an anode of a diode of the second sub-assembly.

2. An assembly as claimed in claim 1, wherein there is provided a third sub-assembly comprising three semi-conductor diodes each having one terminal connected to a metal carrier and their other terminal connected to a respective phase connector, said carrier being mounted on an insulating body to which the first and second sub-assemblies are connected.

* * * * *